United States Patent Office 3,669,668

Patented June 13, 1972

3,669,668
PRESENSITIZED PRINTING PLATE COATED WITH COLORANT

Leonard James Watkinson and Brian Joseph Moore, Yorkshire, England, assignors to W. H. Howson Limited, Seacroft, Leeds, England No Drawing. Continuation of abandoned application Ser. No. 639,612, May 19, 1967. This application June 4, 1971, Ser. No. 150,234
Claims priority, application Great Britain, May 26, 1966, 23,754/66
Int. Cl. C03c *1/68*
U.S. Cl. 96—86 P 8 Claims

ABSTRACT OF THE DISCLOSURE

A presensitised printing plate, such as a presensitised photolithographic printing plate or a presensitised photo-engravers plate, comprising a plate of, for example, aluminum, zinc, magnesium or copper having thereon a coating of a light-sensitive resin selected from starch cinnamate, cellulose cinnamate, polyvinyl cinnamate, starch furfurylacrylate, cellulose furfurylacrylate and polyvinyl furfurylacrylate resins, and a colorant.

This is a continuation of Ser. No. 639,612 filed May 19, 1967, now abandoned.

This invention relates to the preparation of a presensitised printing plate, especially to the preparation of a presensitised photolithographic printing plate or presensitised photo-engravers plate (normally known in the art as photo-engravers metal).

In one form of known lithographic printing plate, a water-soluble light-sensitive coating is applied thinly to a grained aluminum foil and exposed under a negative to actinic radiation to insolubilize the exposed areas, the unexposed areas being washed away with water to give an olephilic image on a hydrophilic plate. An aqueous solution of albumen sensitised with a dichromate is a typical example of such a light-sensitive coating. Coatings of this type have, however, serious disadvantages in that once the aluminum plate has been coated and dried, an overall hardening action known as the "dark reaction" sets in, rendering the coating generally isoluble in water and thus incapable of forming an image.

To overcome the limiting factor with regard to the life of a coated plate which is mentioned above plates have been prepared under the general term "presensitised photolithographic plates" whereby a light-sensitive coating is applied to a substrate of paper, aluminum, zinc, copper, hydrolysed cellulose acetate of polyester material, which coating is capable of forming a printing plate months or years after storage. It is with this type of photolithographic plate that the invention is concerned.

Depending on the light-sensitive material, the exposed material and unexposed material may have different solubilities in either water, an aqueous solution or an organic solvent which may or may not be soluble in water. The invention is concerned with the latter type of light-sensitive material i.e. light-sensitive material which is initially capable of being dissolved in organic solvents but which, by the action of actinic radiation under a negative to form exposed areas, becomes progressively more difficult to dissolve until said solvents have no solvency power for these areas. The normal method of processing lithographic printing plates of this kind is first to expose the light-sensitive layer, generally supported on a grained aluminum foil, under a photographic negative to actinic radiation for a time sufficient to insolubilise the exposed areas of the light-sensitive layer. Development of the printing image is then effected by immersing or swabbing the exposed coated plate in a solvent or mixture of solvents to dissolve the unexposed portions of the layer. The plate at this stage is still not fully processed, as the non-printing areas have a tendency to take up printing ink, and thus have to be desensitised. This is effected by rubbing over the foil a known lithographic desensitising solution which normally comprises a water-soluble colloid in water, with or without the presence of citric or phosphoric acid acid and/or their salts. The final step is to make the image areas visible, which may be performed by rubbing with ink or a coloured lacquer.

In one form of known photo-engravers metal, a sheet of zinc, copper or magnesium is thoroughly cleaned and coated with a light-sensitive material. Suitable light-sensitive materials in common use are colloids such as gum arabic, fish glue and polyvinyl alcohol, sensitised with ammonium dichromate solution, which light-sensitive materials are generally applied to the surface of the plate by whirling. The coated plate, after drying, is then exposed under a negative to actinic radiation to insolubilise the exposed areas of the coating, which correspond to areas of the plate which are not to be etched. The unhardened areas of the coating are then removed from the plate by washing with water or other suitable developer. So as to make the image formed by the hardened areas of the coating more visible, and to check that the plate has been fully developed, the plate then has to be stained by immersing for a few minutes in a solution of a dyestuff, such as methyl violet. The stencil so produced is generally not hard enough to withstand the action of the etching solutions to be used and a further step of heating the plate over a gas burner is required. This is known as "burning in" and a great deal of experience is required to judge the correct amount of heat to apply. The plate may then be etched by placing in a tray of suitable etching solution or by using a powderless etching machine.

It is therefore apparent that if the number of steps needed to produce a finished printing plate, i.e. a plate developed, optionally desensitised, having a visible image after processing, is reduced, it will cut down the time needed to process the printing plate and, at the same time, make the process more commercially attractive.

Attempts have been made to overcome this problem by the use of coloured developers, with which, after exposure, a lithographic printing plate is developed by the use of an emulsion containing a dye which colours the image. Such a method is desclosed in United Kingdom specification No. 921,529.

A further method for producing suitably developed lithographic plates having coloured images is to employ wholly solvent developers which may contain either dyes or suspended pigments. These types of developers have been disclosed in our copending British patent application Nos. 35,072/63 and 30,056/64. However, all these developers are designed for use on a lithographic printing plate comprising aluminium, either grained or anodised, zinc, a plastics material, paper or other metal surfaces treated with silicates, chromates or polycomplexes of tungsten or molybdenum, on which is the light-sensitive coating, which coating is essentially colourless.

An important disadvantage of known presensitised printing plates and their production resides in the fact that, on the application of a coloured developer, it is difficult to ascertain whether the unexposed coating has been completely dissolved away because of the masking effect of the dyestuff or suspended pigment in the developer. It is necessary, therefore, to remove excess of the coloured developer from the plate by wiping or by rinsing away with water to check that the unexposed coating has been completely dissolved. An attempt has been made to overcome this disadvantage using a diazo resin coated with a resin containing a colorant (see United Kingdom specification No. 944,276). However, such plates are not completely satisfactory, due especially to the fact that the abrasion-resistant resinous coating containing the colorant and the light-sensitive diazo resin on the plate are not firmly bonded to one another prior to exposure to actinic radiation and therefore such plates are liable to damage prior thereto.

A second disadvantage is that when a coloured developer is used, the image is not immediately apparent but slowly builds up in contrast. A further disadvantage is that because dyestuffs or pigments are used to colour the image, staining of the immediate working area, and in particular the hands of the operative, is inevitable. Additionally, the resin pattern on photo-engravers metal is not normally sufficiently hard to protect the metal from the effects of the etching solution without recourse to the critical burning-in process.

It is an object of the present invention at least to mitigate the aforementioned disadvantages while retaining the advantages of speed of production, visibility of image and cleanness of working.

Thus, in accordance with the invention, there is provided a presensitised printing plate having a coating thereon comprising a light-sensitive resin, selected from starch cinnamate, cellulose cinnamate, polyvinyl cinnamate, starch furfurylacrylate, cellulose furfurylacrylate and polyvinyl furfurylacrylate resins, and a colorant.

Preferably, a presensitised photolithographic printing plate according to the present invention comprises an aluminium plate, either grained or grained and anodised, coated with a light-sensitive layer of a polyvinyl cinnamate resin evenly stained with colorant from a dispersion thereof, and preferably, a presensitised photo-engravers plate according to the present invention comprises a zinc, copper or magnesium plate coated with a light-sensitive layer of a polyvinyl cinnamate resin evenly stained with a colorant from a dispersion thereof.

It has surprisingly been found that the printing plates according to the invention are very resistant to wear when on a printing press and also to etches. The colorant very surprisingly appears to adhere very strongly to the light-sensitive resin, even when applied in the absence of a binder.

Suitable colorants are, for example dyestuffs finely divided pigments or pigment dispersions, but preferably the colorant is a pigment dispersion. Exemplary of suitable colorants are azoic compounds, such as Permanent Bordeaux F2R (C.I. Pigment Red 12), anthraquinoid compounds such as Indanthrene Blue (C.I. Vat Blue 4), Phthalocyanine Blue or Green (C.I. Pigment Blue 15 or C.I. Pigment Green 7) or heavy metal complexes of a basic dye such as Victoria Blue (C.I. Pigment Blue 1).

After the resin coated plate is dried, the colorant is applied over the light-sensitive layer and again the plate is dried. The vehicle used to apply the colorant should not dissolve the light-sensitive coating and the colorant should have a good affinity for the light-sensitive coating when being subjected to treatment with solvents during the subsequent development process. Subject to the aforementioned conditions the choice of materials is not restricted. It has been found, for example, that these requirements are met by applying the colorant from a solvent such as, for example, an alcohol or glycol, e.g. ethyl alcohol, propyl alcohol, butyl alcohol, methyl-iso-butyl cabinol, ethylene glycol, ethyene-glycol-mono-methyl ether or ethylene-glycol-mono-ethyl ether.

After exposure to actinic radiation under a photographic negative for a time sufficient to insolubilies the exposed portion of the light-sensitive layer a clear, colourless developer is applied to the plate, for example, by swabbing with a sponge, cellulose wadding or cotton wool, or by spraying, whereby the image becomes visible and is of good contrast to the background if the plate, which by the same action is desensitised to printing ink if desired. After rinsing excess developer off the plate with water, the plate is ready for use on a printing machine, may be etched with a suitable etchant, or after wiping over with gum arabic solution and dried, may be stored for later use.

In general, a colourless developer will be used with the lithographic plates of the present invention and can be one of two types, that is, either colourless emulsion type or the colourless solvent type. The prerequisite of both types of developer is that they contain an organic solvent capable of dissolving unexposed light-sensitive resins and optionally they are capable of desensitising the non-printing background of the lithographic plate. The solvent to be employed in the preparation of the developer can be readily determined by those skilled in the art given knowledge of the particular light-sensitive resin with which the lithographic plate is coated. For example, a light-sensitive resin prepared from polyvinyl alcohol and cinnamic acid is soluble in hydrocarbons, such as toluene and/or xylene, in admixture with ethyl alcohol; chlorinated hydrocarbons, such as trichloroethylene, perchloroethylene and chlorobenzene; esters, such as amyl acetate and methyl amyl acetate; glycol ether acetates, such as 2-methoxy-ethyl acetate, 2-ethoxy-ethyl acetate and 3-methoxy-butyl acetate; alcohols, such as benzyl alcohol and tetrahydrofurfuryl alcohol; ketones such as methyl-iso-amyl ketone, ethyl-iso-amyl ketone, di-iso-butyl ketone and cyclohexanone, and miscellaneous solvents, such as Tetralin, dimethylformamide, dimethylacetamide, benzaldehyde, nitrobenzene and nitropropane. For the preparation of an emulsion, those solvents which are insoluble in water or virtually so, will be selected from the examples given above.

To desensitise the non-printing areas of a lithographic printing plate, it is necessary to use colloids having lithographic desensitising properties for printing plates. Thus, gum arabic and synthetic materials, such as methyl cellulose, ethyl hydroxyethyl cellulose, sodium carboxymethyl cellulose, sodium alginate and acrylamide copolymers, and phosphoric and citric acids and/or their salts can be used. It should be noted that whilst all these abovementioned colloids are water-soluble and thus, when dissolved in water, are capable of forming colourless emulsion developers with water-insoluble solvents, the choice of colloid for use in a colourless solvent developer is determined by its solubility in the particular solvent selected. If, however, a solvent is used to dissolve the colloid and this solvent is not capable of dissolving the unexposed light-sensitive coating, another organic solvent which is capable of dissolving the light-sensitive coating and which is miscible with the colloid solution may be added to produce a suitable colourless developer solution.

Emulsifying agents can be added to either the emulsion type of developer or solvent type of developer if desired, in the first case to aid the formation of an emulsion and in the second case to keep in suspension the light-sensitive resin when washing the plate with water after development.

Additionally a bactericide can be added to the emulsion developer, in order to prevent amylolytic enzymatic decomposition of the colloid.

The following examples illustrate the invention. All parts are by weight.

EXAMPLE 1

Grained aluminium and grained and anodised aluminium plates were coated with a light-sensitive layer of a polyvinyl cinnamate resin (commercially available from Kodak Limited under the trade designation Kodak Photo Resist) and a colorant was then applied thereto using one of the following compositions:

Colorant A:

| | Parts |
|---|---|
| Irgalite Fast Red MPS 3 | 2 |
| Ester gum | 1 |
| Butyl alcohol | 87 |

Colorant B:

| | |
|---|---|
| Irgalite Victoria Blue SGP1 | 2 |
| Polyvinyl alcohol | 3 |
| Water | 95 |

Colorant C:

| | |
|---|---|
| Irgalite Fast Blue MPS 2 | 2 |
| Shellac | 2 |
| Alcohol | 87 |

Colorant D:

| | |
|---|---|
| Microlith Red RT | 4 |
| Methyl-iso-butyl carbinol | 90 |

Irgalite Fast Red MPS and Microlith Red RT are each a dispersion of an azo pigment, Irgalite Victoria Blue SGP1 is a dispersion of a heavy metal complex of Victoria Blue and Irgalite Fast Blue MPS 2 is a dispersion of a phthalocyanine Blue. The words "Irgalite" and "Microlith" are Trademarks.

The lithographic plates prepared above were then exposed to actinic radiation to insolubilise areas of the coating. The exposed plates were then successfully developed with the following developers, developers A and B being emulsions and developers C, D and E being solutions, to give a desensitized plate.

Developer A

Solvent phase:

| | Parts |
|---|---|
| Ethyl glycol acetate | 35.0 |
| Dimethyl acetamide | 4.8 |
| Polyoxyethylene sorbitan mono laurate | 0.1 |

Aqueous phase:

| | |
|---|---|
| Gum arabic solution S.G. 1.13 | 60.0 |
| Phosphoric acid S.G. 1.75 | 0.1 |

The emulsion was prepared by slowly adding the solvent phase to the aqueous phase with vigorous stirring.

Developer B

Solvent phase:

| | Parts |
|---|---|
| 3-methoxy-butyl acetate | 30.0 |
| Texofor F60 | 1.0 |

Aqueous phase:

| | |
|---|---|
| Sodium hexametaphosphate | 1.0 |
| Citric acid | 3.0 |
| Phosphoric acid S.G. 1.75 | 2.5 |
| Ammonium alginate | 5.0 |
| Sodium citrate | 6.0 |
| Methyl-para-hydroxy benzoate | 0.1 |
| Water to make | 100.0 |

The emulsion was prepared by slowly adding the solvent phase to the aqueous phase with vigorous stirring.

Developer C

| | Parts |
|---|---|
| 30% aqueous gum arabic solution | 50.0 |
| Phosphoric acid S.G. 1.75 | 1.0 |
| Dimethylformamide | 35.0 |
| 3-methoxy-butyl acetate | 15.0 |
| Solumin FX 85S | 0.5 |
| Polyoxyethylene sorbitan mono laurate | 1.0 |

Developer D

| | Parts |
|---|---|
| Dimethylformamide | 79.0 |
| 3-methoxy-butyl acetate | 21.0 |
| Methyl cellulose | 4.0 |
| Phosphoric acid S.G. 1.75 | 0.1 |
| Polyoxyethylene sorbitan mono laurate | 0.5 |

Developer E

| | |
|---|---|
| Methoxy ethyl acetate | 65.5 |
| Isopropyl alcohol | 20.0 |
| Texofor D1 | 7.5 |
| Phosphoric acid S.G. 1.75 | 0.25 |

Texafor F60 and Texafor D1 are polyoxyalkylene condensates and Solumin FX 85S is the sodium salt of a sulphated alkyl phenoxy polyethoxy ethanol. The words "Texafor" and "Solumin" are Trademarks.

EXAMPLE 2

A plate of photo-engravers zinc was cleaned by scrubbing with pumice and water and then thoroughly rinsed with water and dried. The dried zinc plate was then coated with a solution of a polyvinyl cinnamate resin obtainable in commerce from Kodak Limited as "Kodak Photo Resist" by whirling. The plate was then dried to give a plate having thereon a light-sensitive layer. A colorant was then applied thereto using one of the compositions A, B, C or D of Example 1.

The coloured plates were then dried.

The plates prepared as above were then exposed to actinic radiation to insolubilise areas of the coating, by shining light from an arc lamp through a photographic negative, and the exposed plates were then developed by immersing in a tray containing xylene. Other plates prepared and coated as described above with colourants A, B, C and D were developed with a mixture of dimethyl formamide and 2-methoxy-ethyl acetate and also of toluene and ethyl alcohol. In each case a photo-engravers plate was obtained which could be etched with 12% nitric acid without the necessity of burning-in the resin. Satisfactory etched plates were obtained therefrom.

What is claimed is:

1. A presensitized light-sensitive printing plate comprising a support provided with a layer of a light-sensitive resin selected from the group consisting of starch cinnamate, cellulose cinnamate, polyvinyl cinnamate, starch furfurylacrylate, cellulose furfurylacrylate and polyvinyl furfurylacrylate resins, said layer being coated with a colorant.

2. A plate according to claim 1, wherein the light-sensitive resin is a polyvinyl cinnamate resin.

3. A plate according to claim 1, wherein the coating or colorant is applied by applying a colored lacquer to the layer of light-sensitive resin, said lacquer comprising said colorant and a binder.

4. A plate according to claim 3, wherein the binder is selected from the group of binders consisting of ester gum, polyvinyl alcohol and shellac.

5. A plate according to claim 1, wherein the colorant is selected from the group of colorants comprising dyestuffs, finely divided pigments and pigment dispersions.

6. A plate according to claim 1, wherein the support is selected from the group of supports consisting of grained aluminum supports and grained and anodized aluminum supports.

7. A plate according to claim 1, wherein the support is formed from a metal selected from the group consisting of zinc, copper and magnesium.

8. A plate according to claim 6, wherein the colorant is selected from the group consisting of azo pigment dispersions, phthalocyanine pigment dispersions and heavy metal pigment dispersions.

References Cited

UNITED STATES PATENTS

| | | | |
|---|---|---|---|
| 2,063,348 | 12/1936 | Seymour | 96—115 |
| 2,690,966 | 10/1954 | Minsk et al. | 96—115 |
| 2,732,301 | 1/1956 | Robertson et al. | 96—115 |
| 2,747,997 | 5/1956 | Smith et al. | 96—115 |
| 2,751,296 | 6/1956 | Minsk et al. | 96—115 |
| 2,787,543 | 4/1957 | Murray et al. | 96—115 |
| 2,856,284 | 10/1958 | Hamm | 96—115 |
| 3,148,064 | 9/1964 | Rauner et al. | 96—115 X |

RONALD H. SMITH, Primary Examiner

U.S. Cl. X.R.

96—115 R, 35.1, 84 R